(12) United States Patent
Paul

(10) Patent No.: US 9,876,486 B2
(45) Date of Patent: Jan. 23, 2018

(54) CLOCK GATED FLIP-FLOP

(71) Applicant: MARVELL WORLD TRADE LTD., St. Michael (BB)

(72) Inventor: Gideon Paul, Modiin (IL)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/464,600

(22) Filed: Mar. 21, 2017

(65) Prior Publication Data

US 2017/0194945 A1    Jul. 6, 2017

Related U.S. Application Data

(63) Continuation of application No. 14/823,647, filed on Aug. 11, 2015, now Pat. No. 9,621,144.

(60) Provisional application No. 62/042,551, filed on Aug. 27, 2014, provisional application No. 62/088,021, filed on Dec. 5, 2014.

(51) Int. Cl.

| H03K 3/356 | (2006.01) |
|---|---|
| *H03K 3/012* | (2006.01) |
| *H03K 3/3562* | (2006.01) |
| *H03K 3/66* | (2006.01) |
| *H03K 5/24* | (2006.01) |

(52) U.S. Cl.
CPC ......... *H03K 3/012* (2013.01); *H03K 3/35625* (2013.01); *H03K 3/66* (2013.01); *H03K 5/24* (2013.01)

(58) Field of Classification Search
CPC ........... H03K 3/66; H03K 3/0372; H03K 5/24

USPC .................................................. 327/202–219
See application file for complete search history.

(56) References Cited

U.S. PATENT DOCUMENTS

| 4,575,648 A | * | 3/1986 | Lee | H03K 19/0948 |
|---|---|---|---|---|
| | | | | 326/54 |
| 5,961,649 A | | 10/1999 | Khandekar et al. | |
| 7,131,092 B2 | | 10/2006 | Ham | |
| 8,339,170 B1 | | 12/2012 | Holzman | |
| 8,593,194 B2 | | 11/2013 | Bazes | |
| 2004/0078741 A1 | | 4/2004 | Morton | |
| 2004/0246027 A1 | | 12/2004 | Dhong et al. | |
| 2007/0146032 A1 | * | 6/2007 | Sedlak | H03K 3/356173 |
| | | | | 327/218 |
| 2007/0146033 A1 | * | 6/2007 | Pesci | H03K 3/356156 |
| | | | | 327/218 |

(Continued)

OTHER PUBLICATIONS

Power Saving Latches; Gideon Paul; U.S. Appl. No. 14/566,387, filed Dec. 10, 2014.

(Continued)

*Primary Examiner* — Thomas Skibinski

(57) ABSTRACT

Aspects of the disclosure provide a data storage circuit. The data storage circuit includes a first latch, a second latch, and a clock gating and buffer circuit. The first latch is configured to provide an intermediate output to the second latch in response to a data input when a clock signal is in a first state and to hold the intermediate output when the clock signal is in a second state, and the second latch is configured to provide a data output in response to the intermediate output and the clock signal. The clock gating and buffer circuit is configured to provide the clock signal, and to suppress providing the clock signal to one or both of the first latch and the second latch when the intermediate output stays unchanged.

20 Claims, 4 Drawing Sheets

(56) References Cited

U.S. PATENT DOCUMENTS

2009/0256609 A1* 10/2009 Naffziger ............... H03K 3/012
327/203
2011/0285431 A1 11/2011 Tang et al.
2012/0131526 A1 5/2012 Schreiber

OTHER PUBLICATIONS

International Search Report and Written Opinion of the International Searching Authority with Search History dated Dec. 28, 2015 in PCT/IB2015/056274.

* cited by examiner

CLOCK GATED FLIP-FLOP

INCORPORATION BY REFERENCE

This application is a continuation of U.S. application Ser. No. 14/823,647, filed Aug. 11, 2015, which claims the benefit of U.S. Provisional Application No. 62/042,551, "EFFICIENT STANDARD FLIP-FLOP" filed on Aug. 27, 2014, and U.S. Provisional Application No. 62/088,021, "CLOCK GATED STANDARD FF" filed on Dec. 5, 2014. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Flip-flops or latches are widely used in various integrated circuits (IC), such as sequential logic circuits, synchronous circuits, and the like. In an example, a processor for processing packet data on a computer network is implemented using a pipeline architecture having a plurality of sequential processing stages. Flip-flops are used throughout and between the pipeline stages to sample signals and to perform various logic operations. The flip-flops are clocked to synchronize various logic operations, for example. The activities of the flip-flops consume a relatively large portion of power consumed by the processor circuitry.

SUMMARY

Aspects of the disclosure provide a data storage circuit. The circuit includes a first latch, a second latch, and a clock gating and buffer circuit. The first latch is configured to provide an intermediate output to the second latch in response to a data input when a clock signal is in a first state and to hold the intermediate output when the clock signal is in a second state, and the second latch is configured to provide a data output in response to the intermediate output and the clock signal. The clock buffer circuit is configured to provide the clock signal to one or both of the first latch and the second latch, and to suppress providing the clock signal to one or both of the first latch and the second latch when the intermediate output stays unchanged.

According to an aspect of the disclosure, the clock gating and buffer circuit is configured to compare the intermediate output with the data output, and to suppress providing the clock signal to one or both of the first latch and the second latch based on the comparison. In an embodiment, the clock gating and buffer circuit includes a comparison circuit configured to compare a signal on an internal node of the second latch with the intermediate output, the signal on the internal node is indicative of the data output, and the internal node is off a signal path from the intermediate output to the data output. In an example, the comparison circuit is configured to compare the intermediate output with the data output, and to sustain the clock signals in the first state when the intermediate output is the same as the data output.

In an embodiment, the comparison circuit includes a cross-coupled differential pair configured to compare the intermediate output and the data output. In an example, the cross-coupled differential pair is configured to shut off current paths from a clock drive inverter to ground based on the comparison, such that the clock signal to one or both of the first latch and the second latch is selectively shut off. In an example, the clock buffer circuit is modified from a standard flip-flop circuit in a library with an addition of the cross-coupled differential pair.

Aspects of the disclosure provide a method. The method includes providing, by a clock gating and buffer circuit, a clock signal to a first latch and a second latch. The first latch provides an intermediate output to the second latch in response to a data input when the clock signal is in a first state and holds the intermediate output when the clock signal is in a second state, and the second latch provides a data output in response to the intermediate output and the clock signal. Further, the method includes suppressing providing the clock signal to one or both of the first latch and the second latch when the intermediate output stays unchanged.

Aspects of the disclosure provide an apparatus that includes an integrated circuit (IC) chip having a flip-flop circuit. The flip-flop circuit includes a first latch, a second latch and a clock gating and buffer circuit. The first latch is configured to provide an intermediate output to the second latch in response to a data input when a clock signal is in a first state and to hold the intermediate output when the clock signal is in a second state, and the second latch is configured to provide a data output in response to the intermediate output and the clock signal. The clock gating and buffer circuit is configured to provide the clock signal to one or both of the first latch and the second latch, and to suppress providing the clock signal to one or both of the first latch and the second latch when the intermediate output stays unchanged.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
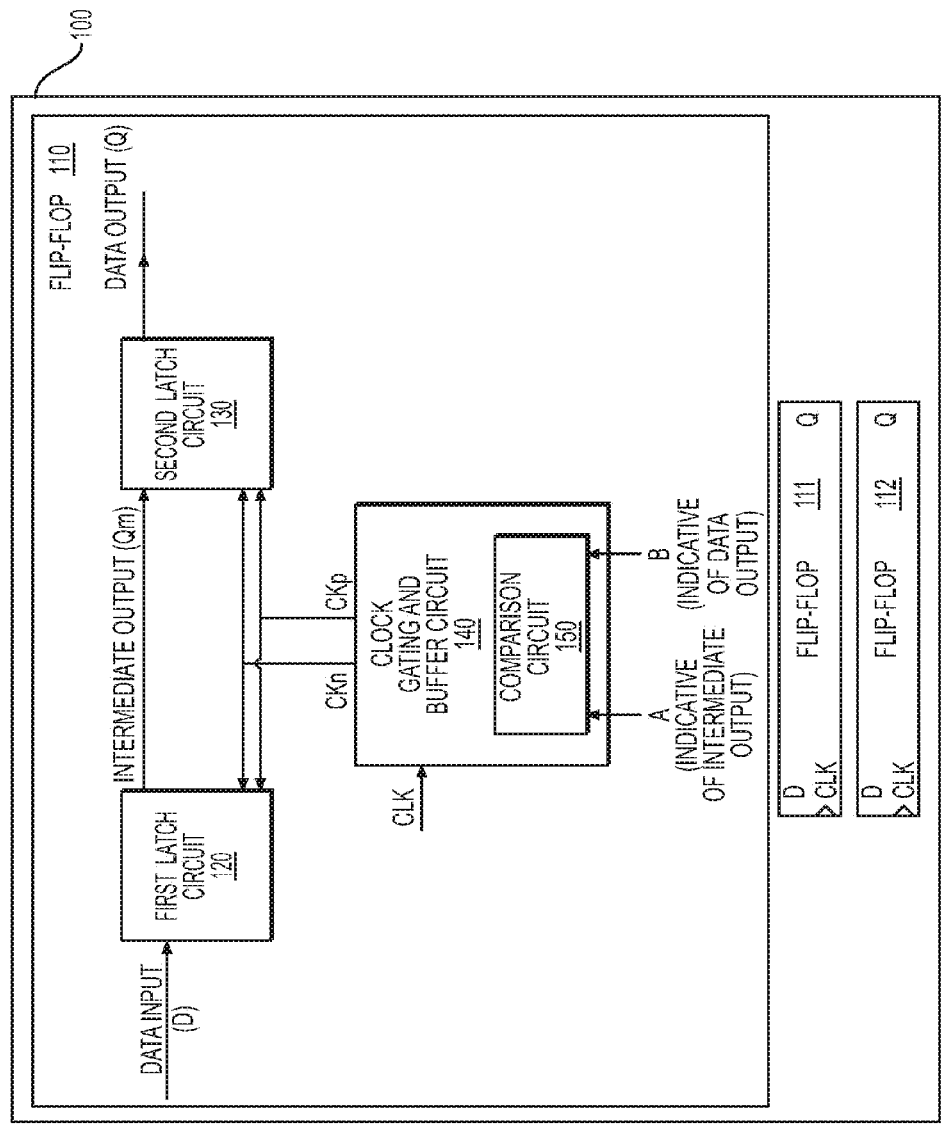
FIG. 1 shows a block diagram of an electronic device example 100 according to an embodiment of the disclosure.

FIG. 1 shows a block diagram of a circuit example 100 according to an embodiment of the disclosure. The circuit 100 includes a plurality of flip-flops 110-112, for example D type flip-flops, among which at least one flip-flop, such as the flip-flop 110, is clock gated to save power. The flip-flop 110 operates in response to a clock signal CLK to sample a data input (D), hold the data input for a period of time and generate a data output (Q). The flip-flop 110 includes a clock gating and buffer circuit 140 configured to buffer the clock signal CLK, and to selectively provide clock signals CKn and CKp for controlling the operation of the flip-flop 110. The clock signals CKn and CKp are gated, that is to say supplied or suppressed, based at least on a comparison of data supplied to or passed through the flip-flop 110 to data that is output from the flip-flop 110, to save power.

The circuit 100 can be any suitable circuit used in an electronic device. In an embodiment, the circuit 100 is an integrated circuit (IC) chip, for example a system on a chip (SOC), or any other suitable unit or module in the SOC. In different embodiments, the circuit 100 includes various circuit components, such as digital circuit, analog circuit, mixed signal circuit, and the like integrated on the IC chip. In an example, the circuit 100 is used in a packet processor for processing data packets on a computer network. The packet processor is suitably implemented in a pipeline architecture that includes a plurality of flip-flops in pipeline stages themselves as well as flip-flops coupling the pipeline stages to buffer signals between the pipeline stages. The flip-flops are synchronized based on a clock signal, such as a system clock, in an embodiment. In an example, the clock signal potentially serves several flip-flops. One or more of the flip-flops 110-112 are configured according to the micro-architecture of flip-flop 110 to save power. Thus, in another example, the circuit 100 is suitably used in a battery-powered device with a low power requirement, such as a smart phone, a tablet computer, and the like. In still another embodiment, the circuit 100 is used in a high power consuming device, such as a network switch.

According to an aspect of the disclosure, the flip-flop 110 includes a first latch circuit 120, a second latch circuit 130, and the clock gating and buffer circuit 140. In the FIG. 1 example, the first latch circuit 120 and the second latch circuit 130 are coupled together to form a master-slave type D flip-flop. The clock gating and buffer circuit 140 receives the clock signal CLK and selectively provides the clock signals CKn and CKp to the first latch circuit 120 and/or to the second latch circuit 130 to control the operation of the flip-flop 110.

Specifically, the first latch circuit 120 is configured to receive the data input (D), hold data in response to the data input (D) based on the clock signals CKn and CKp, and provide an intermediate output (Qm) according to the data held in the first latch circuit 120. Similarly, the second latch circuit 130 is configured to receive the intermediate output (Qm) of the first latch, hold the intermediate output (Qm) based on the clock signals CKn and CKp, and provide the data output (Q) according to data held in the second latch circuit 130.

According to an aspect of the disclosure, the clock gating and buffer circuit 140 selectively provides the clock signals CKn and CKp to drive one or both of the first latch and the second latch as a function of the respective states of the data input (D) to the first latch or the intermediate output of the first latch (Qm) relative to the state of data out (Q) so as to selectively suppress state transitions of the first latch 120 and the second latch 130 and save power. Specifically, the clock gating and buffer circuit 140 includes a comparison circuit 150 configured to receive two inputs A and B, compare the two inputs A and B, and then selectively provide the clock signals CKn and CKp based on the comparison. In an embodiment, one of the two inputs A and B, such as the input A, is the intermediate output (Qm), and is indicative of most recent data input. Optionally, input A is from the data input (D) itself. The other input, such as the input B, is the data output (Q) or equivalent to the data output (Q). It is noted that the data output (Q) is indicative of data previously input to and stored in flip-flop 110. When the two inputs A and B are both of the same logical value (e.g., the data input stays the same), the clock gating and buffer circuit 140 suppresses the clock signals CKn and CKp, thereby suppressing respective changes to the state of first latch 120 and second latch 130, to save power; and when the two inputs A and B are of different logical values (e.g., the data input changes relative to the data output), the clock gating and buffer circuit 140 provides the clock signals CKn and CKp to one or both of the first latch and the second latch based on the clock signal CLK to thereby enable the latches to change their respective states, store the new input data and update the data output (Q).

In an embodiment, the clock signal CLK is inverted to generate the clock signal CKn and the clock signal CKn is further inverted to generate the clock signal CKp. The clock signals CKn and CKp are provided to the D flip-flop 110 in two states, in an embodiment. When the clock signal CKn is logic "1", and the clock signal CKp is logic "0", the clock signals CKn and CKp are provided to the D flip-flop in a first state, and when the clock signal CKn is logic "0", and the clock signal CKp is logic "1", the clock signals CKn and CKp are provided to the D flip-flop in a second state.

In an example, when the clock signals CKn and CKp are in the first state, the clock signals CKn and CKp enable the first latch circuit 120 to receive the data input, and provide the intermediate output (Qm) in response to the data input (D). Further, the clock signals CKn and CKp in the first state allow the second latch 130 to be locked to hold the stored value in the second latch 130 and provide the data output (Q) based on the stored value.

Further, in the example, at the time the clock signals CKn and CKp change from the first state to the second state, the first latch 120 is locked by the clock signal CKn and CKp to hold the stored data, and then provide the intermediate output (Qm) based on the stored data, and the second latch 130 is enabled to receive the intermediate output (Qm), buffer data in response to the intermediate output (Qm), and generate the data output (Q) based on the buffered data.

Further, in the example, when the two inputs A and B to the comparison circuit 150 have the same logical value, the clock signals CKn and CKp are gated so as to stay in the first state in spite of the transitions in the clock signal CLK. It is noted that when the clock signals CKn and CKp are in the first state, the intermediate output (Qm) changes in response to changes in the data input (D). Thus, when the clock signals CKn and CKp are in the first state and the data input (D) changes, the intermediate output (Qm) changes as well to reflect the logical value of input data (D) and can be different from the data output (Q). Thus when the data input (D) changes its logical value, the intermediate data output (Q) changes as well and the clock gating and buffer circuit 140 de-suppresses clock signals CKn and CKp so that they change to the second state such that flip-flop 110 stores the new data, and updates the data output (Q) to reflect the new data input.

Figure 2:
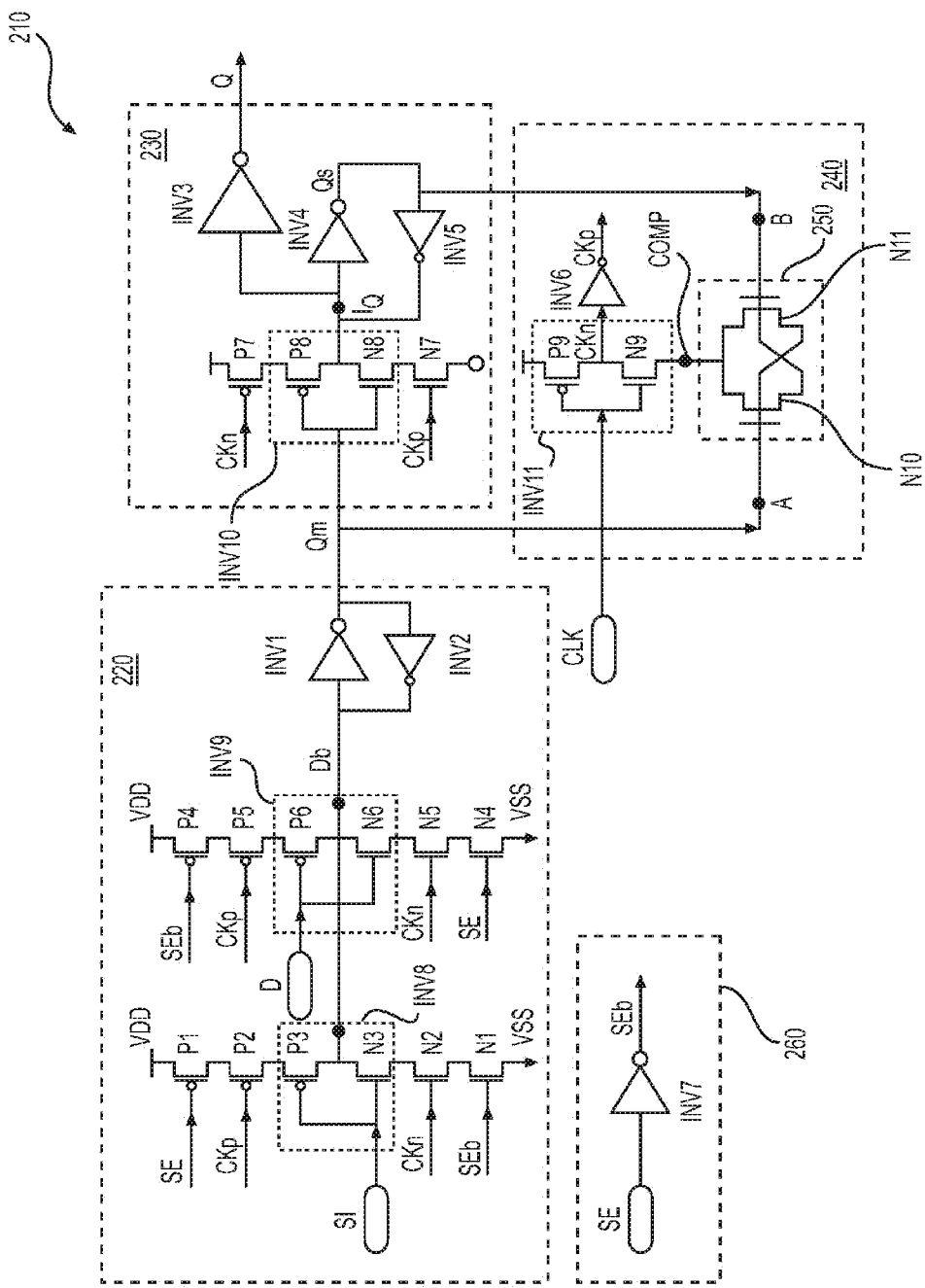
FIG. 2 shows a schematic diagram of a flip-flop example 210 according to an embodiment of the disclosure.

FIG. 2 shows a schematic diagram of a flip-flop example 210 according to an embodiment of the disclosure. The flip-flop 210 can be used in the circuit 100 as the flip-flop 110. In the FIG. 2 example, the flip-flop 210 is a scan enabled flip-flop 210, such as a D flip-flop. The scan enabled flip-flop 210 is configured to receive a data input (D) and a scan input (SI), and select one of the data input (D) and the scan input SI as input based on a scan enable signal (SE). The scan flip-flop 210 includes a first latch circuit 220, a second latch circuit 230, a clock gating and buffer circuit 240, and a scan control buffer circuit 260 coupled together as shown in FIG. 2.

The scan control buffer circuit 260 includes an inverter INV7 to receive the scan enable signal SE and generate an inverted scan enable signal SEb. The scan enable signal SE and the inverted scan enable signal SEb are provided to the first latch circuit 220 to select a suitable input, namely a data input when in operational mode or a scan input when in a testing mode.

The clock buffer circuit 240 receives a clock signal CLK, generates two clock signals CKn and CKp, and provides the two clock signals to the first latch circuit 220 and the second latch circuit 230 to control the latch operations.

The first latch circuit 220 and second latch circuit 230 are coupled together in a master-slave type D flip-flop. The first latch circuit 220 receives the data input D and the scan input SI, and selects one of the data input D and the scan input SI to drive a node Db based on the scan enable signal SE and the inverted scan enable signal SEb. Further, the first latch circuit 220 stores data in response to the selected input under the control of the clock signals CKn and CKp provided by the clock buffer circuit 240, and provides an intermediate output (Qm) according to the stored data in the first latch circuit 220. The second latch circuit 230 receives the intermediate output (Qm), stores data in response to the intermediate output (Qm) under the control of the clock signals CKn and CKp provided by the clock buffer circuit 240, and provides a data output (Q) according to stored data in the second latch circuit 230.

Specifically, the clock gating and buffer circuit 240 includes a P-type metal-oxide-semiconductor (MOS) transistor P9, N-type MOS transistors N9-N11, and an inverter INV6 coupled together as shown in FIG. 2. The P-type MOS transistor P9 and the N-type MOS transistor N9 are coupled together to form an inverter INV11 to receive the clock signal CLK and generate the clock signal CKn that is inverted relative to the clock signal CLK. The N-type MOS transistors N10 and N11 form a cross-coupled differential pair 250 to compare two inputs A and B. The cross coupled differential pair 250 is coupled to the source of the N-type MOS transistor N9, shown as node COMP in FIG. 2. The inverter INV6 receives the clock signal CKn and generates the clock signal CKp which is inverted relative to CKn, in an embodiment.

In the FIG. 2 example, the input A is the intermediate output (Qm), and the input B is indicative of the data output (Q). Alternatively, input A is branched from before the data is provided to a data input of first latch circuit 220. When both the input A and the input B are of the same value, such as logic "1" or logic "0", the clock signal CKn stays high (e.g. logic "1"), and the clock signal CKp stays low (e.g., logic "0") irrespective of the transitions in the clock signal CLK. When the input A is different from the input B, the clock signals CKn and CKp change values in response to transitions in the clock signal CLK. For example, the clock signal CKn is inverted from the clock signal CLK, and the clock signal CKp is about the same as the clock signal CLK.

The first latch circuit 220 includes N-type MOS transistors N1-N6, P-type MOS transistors P1-P6, and inverters INV1-INV2 coupled together as shown in FIG. 2, in an embodiment. The P-type MOS transistor P3 and the N-type MOS transistor N3 are coupled together to form an inverter INV8 to receive the scan input SI and drive the node Db according to the scan input SI. The P-type MOS transistors P1-P2 and the N-type MOS transistors N1-N2 are coupled to the inverter INV8 to control the inverter INV8 based on the scan enable signals SE and SEb and the clock signals CKn and CKp.

The P-type MOS transistor P6 and the N-type MOS transistor N6 are coupled together to form an inverter INV9 to receive the data input D and drive the node Db according to the data input D. The P-type MOS transistors P4-P5, and the N-type MOS transistors N4-N5 are coupled to the inverter INV9 to control the inverter INV9 based on the scan enable control signals SE and SEb and the clock signals CKn and CKp.

The inverters INV1 and INV2 form a feedback loop coupled to the node Db to latch the data at the node Db and drive the intermediate output Qm accordingly.

According to an aspect of the disclosure, one of the inverters INV8 and INV9 is selected based on the scan enable signals SE and SEb. In an example, when the scan enable signal SE is logic "1", the inverted scan enable signal SEb is logic "0", thus the inverter INV9 is selected to drive the node Db; when the scan enable signal SE is logic "0", the inverted scan enable signal SEb is logic "1", thus the inverter INV8 is selected to drive the node Db.

The second latch circuit 230 includes N-type MOS transistors N7-N8, P-type MOS transistors P7-P8, and inverters INV3-INV5 coupled together as shown in FIG. 2. The P-type MOS transistor P8 and the N-type MOS transistor N8 are coupled together to form an inverter INV10 to receive the intermediate output Qm and drive a node $I_Q$. The P-type MOS transistor P7 and the N-type MOS transistor N7 are coupled to the inverter INV10 to control the inverter INV10 based on the clock signals CKn and CKp. The inverters INV4 and INV5 form a feedback loop to latch the data at the node $I_Q$. The inverter INV3 drives the data output Q.

In the FIG. 2 example, the intermediate output Qm is provided to the clock buffer circuit 240 as the input A, and an output Qs of the inverter INV4 is provided to the clock buffer circuit 240 as the input B. It is noted that the output Qs is of the same logical value as the data output Q in the FIG. 2 example.

The operations of the flip-flop 210 is described in detail with reference to FIG. 3.

Figure 3:
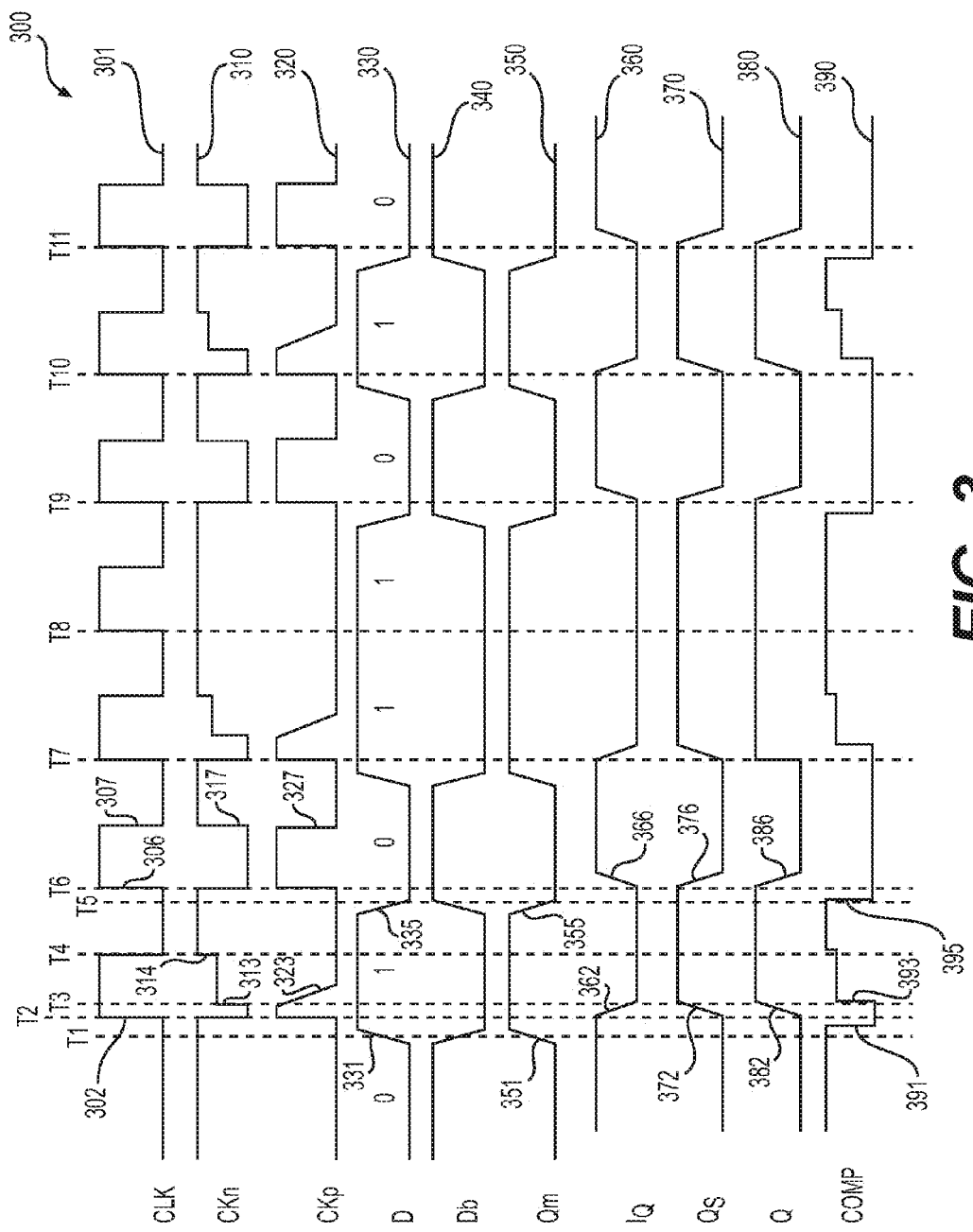
FIG. 3 shows a plot of waveform example 300 according to an embodiment of the disclosure.

FIG. 3 shows a plot 300 of waveforms for the flip-flop 210 according to an embodiment of the disclosure. In this example, the data input D is selected as the input to the flip-flop 210 (e.g., the scan enable signal SE is logic "1"). The plot 300 includes a waveform 301 for the clock signal CLK, a waveform 310 for the clock signal CKn, a waveform 320 for the clock signal CKp, a waveform 330 for the data input D, a waveform 340 for the signal at the node Db, a waveform 350 for the intermediate output Qm, a waveform 360 for the signal at the node $I_Q$, a waveform 370 for the signal Qs, a waveform 380 for the data output Q, and a waveform 390 for the signal at the node COMP.

In the FIG. 3 example, initially (e.g., before time T1), the data input D is logic "0", the intermediate output Qm is logic "0", and the data output Q and the output Qs are logic "0". Thus, both the input A and the input B to the cross-coupled differential pair 250 are both logic "0", then both N-type MOS transistors N10 and N11 are turned off, and there is no current path from the node COMP to ground. The clock signal CKn is logic "1" due to the charging from VDD via the P-type MOS transistor P9, and the clock signal CKp is logic "0". The clock signals CKn and CKp enable the inverter INV9 to receive the data input D and drive the node Db, thus in the first latch circuit 220, the intermediate output Qm can change in response to the data input D. Also, the clock signals CKn and CKp disable the inverter INV10 and lock data stored in the second latch circuit 230, thus the data output Q is stable.

At time T1, the data input D changes from logic "0" to logic "1" as shown by 331. The change of the data input D causes the intermediate output Qm to change to logic "1" as shown by 351. The change of the intermediate output Qm makes the input A different from the input B for the cross-coupled differential pair 250, the N-type MOS transistor N10 is turned on to discharge the node COMP via the N-type MOS transistor N10 and an N-type MOS transistor (not shown) in the INV4, thus the voltage at the node COMP is pulled down as shown by 391.

The voltage pulling down at the node COMP enables the clock signal CKn and the clock signal CKp to change in response to the transition in the clock signal CLK.

At time T2, the clock signal CLK changes from logic "0" to logic "1" as shown by 302. The change of the clock signal CLK turns on the N-type MOS transistor N9 and turns off the P-type MOS transistor P9, thus the clock signal CKn changes to logic "0", and the clock signal CKp changes to logic "1". The changes of the clock signals CKn and CKp disable the inverter INV9 to lock the data in the first latch circuit 220. Also, the changes of the clock signals CKn and CKp enable the inverter INV10 to drive the node $I_Q$ according to the intermediate output Qm, thus the node $I_Q$ changes from logic "1" to logic "0" as shown by 362. The inverter INV3 drives the data output Q according to the signal at the node $I_Q$, and the inverter INV4 drives the output Qs according to the signal at the node $I_Q$. Thus the data output Q changes from logic "0" to logic "1", as shown by 382, and the output Qs changes from logic "0" to logic "1" as shown by 372.

The change of the output Qs makes the input B to be the same as the input A for the cross-coupled differential pair 250. When the input A and the input B are logic "1", the node COMP is charged up via the N-type MOS transistors N10 and N11 until the N-type MOS transistors N10 and N11 are turned off, for example when the voltage at the node COMP rises to about a threshold voltage lower than the voltage of the input A and the input B, as shown by 393 at time T3. In addition, because the N-type MOS transistor N9 is turned on, the clock signal CKn also rises up, as shown by 313, and the clock signal CKp drops down, as shown by 323.

The changes of the clock signals CKn and CKp (shown by 313 and 323) disable the inverter INV10 to lock the store data in the second latch circuit 230. Also, the changes of the clock signals CKn and CKp enable the inverter INV9 to receive the data D and drive the node Db accordingly.

At time T4, the clock signal CLK changes from logic "1" to logic "0", the P-type MOS transistor P9 turns on and the N-type MOS transistor N9 turns off, and the clock signal CKn charges up to about VDD, for example, as shown by 314.

At time T5, the data input D changes from logic "1" to logic "0" as shown by 335. The change of the data input D causes the intermediate output Qm to change to logic "0" as shown by 355. The change of the intermediate output Qm makes the input A different from the input B for the cross-coupled differential pair 250. Specifically, the gate terminal of the N-type MOS transistor N10 (also the source of the N-type MOS transistor N11) is discharged through an N-type MOS transistor (not shown) in the inverter INV1. Thus, the N-type MOS transistor N11 is turned on, the node COMP is discharged via the N-type MOS transistor N11 and the N-type MOS transistor (not shown) in the INV1, thus the voltage at the node COMP is pulled down as shown by 395.

The voltage pulling down at the node COMP enables the clock signal CKn and the clock signal CKp to change in response to the transition in the clock signal CLK.

At time T6, the clock signal CLK changes from logic "0" to logic "1" as shown by 306. The change of the clock signal CLK turns on the N-type MOS transistor N9 and turns off the P-type MOS transistor P9, thus the clock signal CKn changes to logic "0", and the clock signal CKp changes to logic "1". The changes of the clock signals CKn and CKp disable the inverter INV9 to lock the data in the first latch circuit 220. Also, the changes of the clock signals CKn and CKp enable the inverter INV10 to drive the node $I_Q$ according to the intermediate output Qm, thus the node $I_Q$ changes from logic "0" to logic "1" as shown by 366. The inverter INV3 drives the data output Q according to the signal at the node $I_Q$, and the inverter INV4 drives the output Qs according to the signal at the node $I_Q$. Thus the data output Q changes from logic "1" to logic "0", as shown by 386, and the output Qs changes from logic "1" to logic "0" as shown by 376.

The change of the output Qs makes the input B to be the same as the input A for the cross-coupled differential pair 250. When the input A and the input B are logic "0", both the N-type MOS transistors N10 and N11 are turned off.

When the clock signal CLK changes from logic "1" to logic "0", as shown by 307, the P-type MOS transistor P9 turns on and the N-type MOS transistor N9 turns off, and the clock signal CKn changes from logic "0" to logic "1" as shown by 317 and the clock signal CKp changes from logic "1" to logic "0", for example, as shown by 327.

The changes of the clock signals CKn and CKp (shown by 317 and 327) disable the inverter INV10 to lock the stored data in the second latch circuit 230. Also, the changes of the clock signals CKn and CKp enable the inverter INV9 to receive the data D and drive the node Db accordingly.

It is noted that when the data input D does not change, such as at about time T8, the clock signal CKn and CKp do not change in spite of the signal transition in the clock signal CLK.

According to an aspect of the disclosure, the flip-flop 210 is implemented based on a standard flip-flop cell in a library. It is noted that the technique can be applied to any suitable flip-flop.

Figure 4:
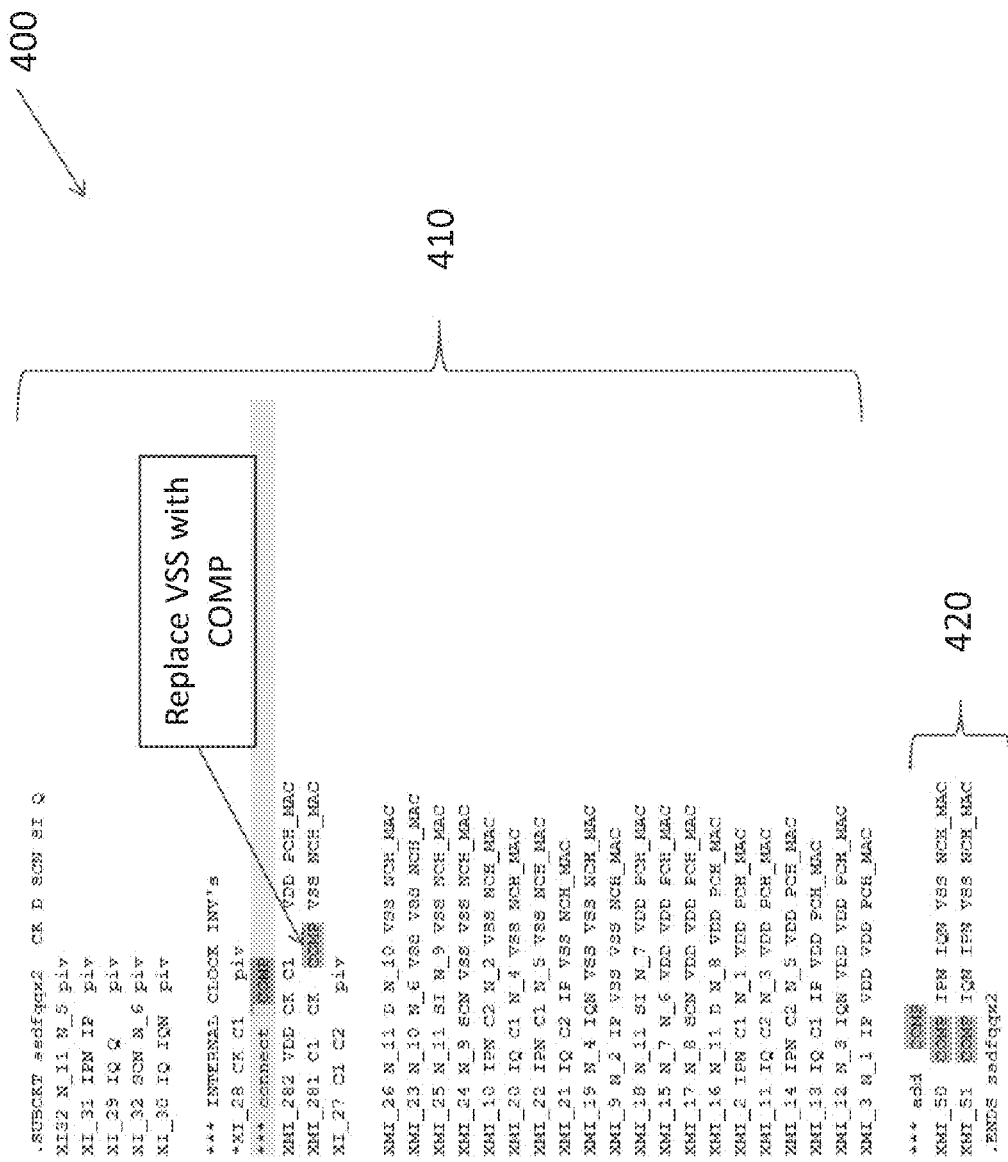
FIG. 4 shows a netlist example 400 according to an embodiment of the disclosure.

FIG. 4 shows a netlist 400 of a gated flip-flop according to an embodiment of the disclosure. The netlist 400 describes the flip-flop 210. The netlist 400 includes a first portion 410 and a second portion 420. In an example, the first portion 410 is modified from a netlist of an existing D flip-flop (e.g. a D flip-flop in a standard library). The netlist of the existing D flip-flop is modified by replacing a VSS connection at a source terminal of an N-type MOS transistor (e.g., N-type MOS transistor N9 in FIG. 2) with a node, such as a node COMP. The second portion 420 defines two additional transistors (e.g., N-type MOS transistors N10 and N11) to the existing flip-flop. The two additional transistors are coupled to the node COMP.

According to an aspect of the disclosure, the power saving by the flip-flop 210 depends on activity of the data input. In an example, the activity of the data input is expressed as a percentage of a number of transitions in the data input to a total number of clock cycles in a time duration. In a simulation, the existing D flip-flop consumes 21% more power than the flip-flop 210 when the activity of the data input is lower than 11%. And for data activity is about 5%, the flip-flop 210 consumes 44% less power than the existing flip-flop. Also, the flip-flop 210 has much less current glitches than the existing D flip-flop.

According to another aspect of the disclosure, the addition of the two transistors to the existing D flip-flop does not affect the external timing characteristic of the D flip-flop. For example, the signal at the node Qs, instead of the data output Q, is used for comparison to reduce time influence to the main signal propagation path. Thus, in a chip design example, replacing existing D flip-flops in a design with the flip-flop 210 does not affect chip clocking or register-transfer level (RTL) model.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A data storage circuit, comprising:
   a first latch and a second latch, the first latch being configured to provide an intermediate output to the second latch in response to a data input, the second latch being configured to provide a data output in response to the intermediate output and a clock signal; and
   a clock gating circuit having a pair of cross coupled transistors, the clock gating circuit configured to receive a clock input for driving the first and second latches and having a power source that is connected to an output of the pair of cross coupled transistors, the pair of cross coupled transistors being configured to compare a first signal from the first latch to a second signal from the second latch, and to disconnect the clock input from the first and second latches in response to a first value of the first signal being equal to a second value of the second signal.

2. The data storage circuit of claim 1, wherein the first latch is further configured to provide the intermediate output to the second latch in response to the data input when the clock signal is in a first state and to hold the intermediate output when the clock signal is in a second state different from the first state.

3. The data storage circuit of claim 2, wherein the first latch is further configured to hold the intermediate output when the clock signal is in a second state different from the first state.

4. The data storage circuit of claim 2, wherein the clock gating circuit is configured to compare the intermediate output with the data output, and to sustain the clock signal in the first state when the intermediate output is the same as the data output.

5. The data storage circuit of claim 1, further comprising:
   an inverter configured to invert the clock input to generate a first clock signal, and to invert the first clock signal to generate a second clock signal.

6. The data storage circuit of claim 5, wherein the clock gating circuit is further configured to provide the first and second clock signals to both of the first latch and the second latch.

7. The data storage circuit of claim 6, wherein the clock gating circuit is further configured to suppress providing the first and second clock signals to one or both of the first latch and the second latch when the intermediate output stays unchanged.

8. The data storage circuit of claim 1, wherein the pair of cross coupled transistors is configured to:
   receive the intermediate output and the data output via gate terminals of the pair of cross coupled transistors;
   compare the intermediate output with the data output; and
   suppress providing the clock signal to one or both of the first latch and the second latch based on the comparison.

9. The data storage circuit of claim 8, wherein the comparison circuit is configured to compare the second signal on an internal node of the second latch with the first signal corresponding to the intermediate output, the second signal on the internal node is indicative of the data output, and the internal node is off a signal path from the intermediate output to the data output.

10. The data storage circuit of claim 1, wherein the pair of cross coupled transistors is configured to shut off current paths from an inverter to ground based on the comparison, and thereby suppress the clock signal provided to the first and second latches.

11. A method, comprising:
    providing, by a first latch, an intermediate output to a second latch in response to a data input;
    providing, by the second latch, a data output in response to the intermediate output and a clock signal; and
    comparing, by a pair of cross coupled transistors of a clock gating circuit, a first signal from the first latch to a second signal from the second latch, the clock gating circuit receiving a clock input for driving the first and second latches and having a power source that is connected to an output of the pair of cross coupled transistors; and
    disconnecting the clock input from the power source in response to a first value of the first signal being equal to a second value of the second signal.

12. The method of claim 11, further comprising:
    providing the intermediate output to the second latch in response to the data input when the clock signal is in a first state; and
    holding the intermediate output when the clock signal is in a second state different from the first state.

13. The method of claim 12, further comprising:
    holding the intermediate output when the clock signal is in a second state different from the first state.

14. The method of claim 12, further comprising:
    comparing the intermediate output with the data output; and
    sustaining the clock signal in the first state when the intermediate output is the same as the data output.

15. The method of claim 11, further comprising:
    inverting the clock input to generate a first clock signal; and
    inverting the first clock signal to generate a second clock signal.

16. The method of claim 15, further comprising:
    providing the first and second clock signals to both of the first latch and the second latch.

17. The method claim 16, further comprising:
    suppressing provisions of the first and second clock signals to one or both of the first latch and the second latch when the intermediate output stays unchanged.

18. The method of claim 11, further comprising:
    receiving, via gate terminals of the pair of cross coupled transistors, the intermediate output and the data output;
    comparing the intermediate output with the data output; and
    suppressing provisions of the clock signal to one or both of the first latch and the second latch based on the comparison.

19. The method of claim 18, further comprising:
    comparing the second signal on an internal node of the second latch with the first signal corresponding to the intermediate output, the second signal on the internal node being indicative of the data output, and the internal node being off a signal path from the intermediate output to the data output.

20. The method of claim 11, further comprising:

shutting off current paths, by the pair of cross coupled transistors, from an inverter to ground based on the comparison, thereby suppressing the clock signal provided to the first and second latches.

\* \* \* \* \*